United States Patent
Lee et al.

(10) Patent No.: US 11,925,063 B2
(45) Date of Patent: Mar. 5, 2024

(54) THIN-FILM TRANSISTOR ARRAY SUBSTRATE AND DISPLAY DEVICE

(71) Applicant: SAMSUNG DISPLAY CO., LTD., Yongin-si (KR)

(72) Inventors: Wonse Lee, Yongin-si (KR); Yujin Jeon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 144 days.

(21) Appl. No.: 17/137,862

(22) Filed: Dec. 30, 2020

(65) Prior Publication Data

US 2021/0359055 A1 Nov. 18, 2021

(30) Foreign Application Priority Data

May 13, 2020 (KR) ........................ 10-2020-0057187

(51) Int. Cl.

| | |
|---|---|
| *H01L 27/14* | (2006.01) |
| *H10K 59/121* | (2023.01) |
| *H10K 59/131* | (2023.01) |
| *G09G 3/3233* | (2016.01) |
| *H01L 27/12* | (2006.01) |
| *H01L 29/786* | (2006.01) |

(52) U.S. Cl.
CPC ..... *H10K 59/1213* (2023.02); *H10K 59/1216* (2023.02); *H10K 59/131* (2023.02); *G09G 3/3233* (2013.01); *G09G 2320/0233* (2013.01); *H01L 27/1222* (2013.01); *H01L 27/124* (2013.01); *H01L 27/1255* (2013.01); *H01L 29/78696* (2013.01)

(58) Field of Classification Search
CPC ............. H01L 27/3262; H01L 27/3265; H01L 27/3276; H01L 27/1222; H01L 27/124; H01L 27/1255; H01L 29/78696; H01L 27/1248; H01L 27/3248; H10K 59/1213; H10K 59/1216; H10K 59/131; H10K 59/123; G09G 3/3233; G09G 2320/0233; G09G 2300/0819; G09G 2300/0842; G09G 2300/0861
USPC .................................................... 257/59, 72
See application file for complete search history.

(56) References Cited

U.S. PATENT DOCUMENTS

| | | |
|---|---|---|
| 6,924,602 B2 | 8/2005 | Komiya |
| 9,412,327 B2 | 8/2016 | Kim |

(Continued)

FOREIGN PATENT DOCUMENTS

| | | |
|---|---|---|
| KR | 1020160095306 A | 8/2016 |
| KR | 1020190126963 A | 11/2019 |

(Continued)

*Primary Examiner* — Tan N Tran
(74) *Attorney, Agent, or Firm* — CANTOR COLBURN LLP

(57) ABSTRACT

A thin-film transistor array substrate includes a substrate, a thin-film transistor disposed on the substrate, where the thin-film transistor includes a semiconductor layer including a channel area and a gate electrode overlapping the channel area, and a storage capacitor including a lower electrode disposed on the channel area and an upper electrode disposed to overlap the lower electrode, where an opening having a single closed curve-shape is defined through the upper electrode. On a plane, the upper electrode includes a first recessed portion and a second recessed portion, each exposing an edge of the lower electrode.

20 Claims, 8 Drawing Sheets

(56) References Cited

U.S. PATENT DOCUMENTS

| | | | |
|---|---|---|---|
| 9,466,652 B2 * | 10/2016 | Kim | ................... H01L 27/3262 |
| 10,019,946 B2 | 7/2018 | Choi | |
| 10,665,657 B2 * | 5/2020 | Kang | ................... H10K 59/131 |
| 2019/0341431 A1 | 11/2019 | Lee et al. | |

FOREIGN PATENT DOCUMENTS

| | | |
|---|---|---|
| KR | 1020200000839 A | 1/2020 |
| KR | 1020200012062 A | 2/2020 |

\* cited by examiner

THIN-FILM TRANSISTOR ARRAY SUBSTRATE AND DISPLAY DEVICE

This application claims priority to Korean Patent Application No. 10-2020-0057187, filed on May 13, 2020, and all the benefits accruing therefrom under 35 U.S.C. § 119, the content of which in its entirety is herein incorporated by reference.

BACKGROUND

1. Field

One or more embodiments relate to a thin-film transistor array substrate and a display device including the thin-film transistor array substrate.

2. Description of Related Art

As the information society develops, the demands for various display devices for displaying images are increasing. In the field of display devices, thin, lightweight and large-area flat panel display devices ("FPD"s) are widely used instead of bulky cathode ray tubes ("CRT"s). FPDs may include liquid crystal display devices ("LCD"s), plasma display panels ("PDP"s), organic light-emitting display devices ("OLED"s), and electrophoretic display devices ("EPD"), for example.

Such display devices may display an image by using a plurality of pixels. Each pixel may include a pixel circuit and a display element, and the pixel circuit may be connected to a scan line and a data line. The pixel circuit may include a storage capacitor and at least one thin-film transistor connected to the scan line or the data line.

The thin-film transistor and storage capacitor of the pixel circuit may be arranged in various structures within a limited space.

SUMMARY

One or more embodiments include a thin-film transistor array substrate and a display device, in which the length of a semiconductor layer of a driving thin-film transistor is increased, while maintaining the capacitance or charged voltages of a storage capacitor of the pixel circuit.

According to an embodiment, a thin-film transistor array substrate includes a substrate, a thin-film transistor disposed on the substrate, where the thin-film transistor includes a semiconductor layer including a channel area, and a gate electrode overlapping the channel area, and a storage capacitor including a lower electrode disposed on the channel area and an upper electrode disposed to overlap the lower electrode, where an opening having a single closed curve-shape is defined through the upper electrode. In such an embodiment, on a plane, the upper electrode includes a first recessed portion and a second recessed portion, each exposing an edge of the lower electrode.

In an embodiment, the first recessed portion exposes a first edge portion of the lower electrode, the second recessed portion exposes a second edge portion of the lower electrode, and the first edge portion and the second edge portion are disposed in parallel to each other in a predetermined direction.

In an embodiment, a sum of an area of the first edge portion and an area of the second edge portion may be constant.

In an embodiment, a first edge length of the first edge portion exposed by the first recessed portion may be the same as a second edge length of the second edge portion exposed by the second recessed portion.

In an embodiment, the thin-film transistor array substrate may further include a scan line extending in a first direction, wherein the first edge portion and the second edge portion may be disposed in parallel to each other in the first direction.

In an embodiment, the channel area may overlap at least one selected from the first edge portion and the second edge portion.

In an embodiment, the thin-film transistor array substrate further includes a scan line extending in a first direction, where the first edge portion and the second edge portion are disposed in parallel to each other in a second direction crossing the first direction.

In an embodiment, the thin-film transistor array substrate may further include a node connection line connected to the lower electrode through the opening.

In an embodiment, the at least one thin-film transistor may include a compensation thin-film transistor, and the compensation thin-film transistor is connected to the node connection line.

In an embodiment, the at least one thin-film transistor may include a driving thin-film transistor, and a driving gate electrode of the driving thin-film transistor is integrally formed with the lower electrode as a single unitary unit.

In an embodiment, a driving semiconductor layer of the driving thin-film transistor may have a curved shape.

According to an embodiment, a display device includes a substrate, a scan line extending in a first direction on the substrate, a data line extending in a second direction crossing the first direction, a pixel circuit electrically connected to the scan line and the data line, and a display element connected to the pixel circuit. In such an embodiment, the pixel circuit includes a driving thin-film transistor disposed on the substrate, where the driving thin-film transistor includes a driving semiconductor layer including a driving channel area and a driving gate electrode disposed to overlap the driving channel area, and a storage capacitor including a lower electrode integrally formed with the driving gate electrode as a single unitary unit, and an upper electrode disposed to overlap the lower electrode, where an opening having a single closed curve-shape is defined through the upper electrode. In such an embodiment, on a plane, the upper electrode includes a first recessed portion and a second recessed portion, each exposing an edge of the lower electrode.

In an embodiment, the first recessed portion exposes a first edge portion of the lower electrode, the second recessed portion exposes a second edge portion of the lower electrode, and the first edge portion and the second edge portion are disposed in parallel to each other in the first direction or the second direction.

In an embodiment, a sum of an area of the first edge portion and an area of the second edge portion may be constant.

In an embodiment, a first edge length of the first edge portion exposed by the first recessed portion may be the same as a second edge length of the second edge portion exposed by the second recessed portion.

In an embodiment, the first edge portion and the second edge portion may be disposed in parallel to each other in the first direction, and the driving channel area may overlap at least one of the first edge portion and the second edge portion.

In an embodiment, the first edge portion and the second edge portion may be disposed in parallel to each other in the second direction.

In an embodiment, the pixel circuit may include a node connection line connected to the driving gate electrode through the opening, and a compensation thin-film transistor connected to the driving thin-film transistor through the node connection line.

In an embodiment, the driving semiconductor layer may have a curved shape.

In an embodiment, the display device may further include a driving voltage line connected to the lower electrode.

BRIEF DESCRIPTION OF THE DRAWINGS

The above and other features of the invention will be more apparent by describing in further detail embodiments thereof with reference to the accompanying drawings, in which.

DETAILED DESCRIPTION

Figure 1:
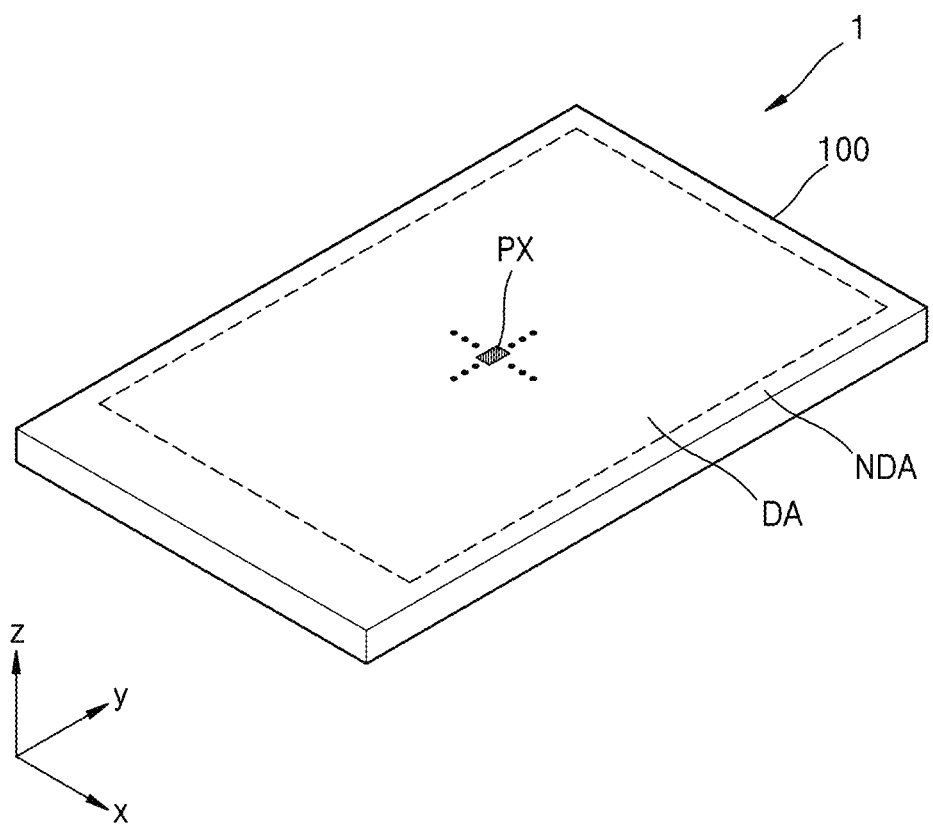
FIG. 1 shows a perspective view schematically illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The present disclosure may undergo various transformations and may have various embodiments, and specific embodiments will be illustrated in the drawings and described in detail in the detailed description. The effects and features of the present disclosure and methods of achieving the same will become apparent with reference to the embodiments described below in detail in connection with the drawings. However, the present disclosure is not limited to the embodiments disclosed below and may be implemented in various forms.

The example embodiments will be described below in more detail with reference to the accompanying drawings. Those components that are the same or are in correspondence are rendered the same reference numeral regardless of the figure number, and redundant explanations are omitted.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

When a certain embodiment may be implemented differently, a specific process order may be performed differently from the described order. For example, two consecutively described processes may be performed substantially at the same time or performed in an order opposite to the described order.

In the embodiments below, when layers, areas, or elements or the like are referred to as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Herein, a display device is a device for displaying an image, and may be a mobile device that is portable, such as a game machine, a multimedia device, and a miniature personal computer ("PC"). Embodiments of the display device may be a liquid crystal display, an electrophoretic display, an organic light-emitting display, an inorganic light-emitting ("EL") display, a field emission display, a surface-conduction electron-emitter display, a quantum dot display, a plasma display, a cathode ray display, and the like. Hereinafter, for convenience of description, embodiments where a display device is an organic light-emitting display device will be described in detail, but not limited thereto. Alternatively, embodiments of the disclosure may be various other types of display devices as described above.

FIG. 1 shows a perspective view schematically illustrating a display device 1 according to an embodiment.

Referring to FIG. 1, an embodiment of the display device 1 may have a display area DA and a non-display area NDA on a substrate 100.

The display area DA displays an image. A plurality of pixels PX may be arranged in the display area DA. The pixels PX are not disposed in the non-display area NDA. The non-display area NDA may completely surround the display area DA. In the non-display area NDA, for example, a driver for providing an electrical signal to the pixels PX may be disposed. The non-display area NDA may include a pad portion (not shown), which is an area to which electronic devices or printed circuit boards may be electrically connected.

Figure 2A:
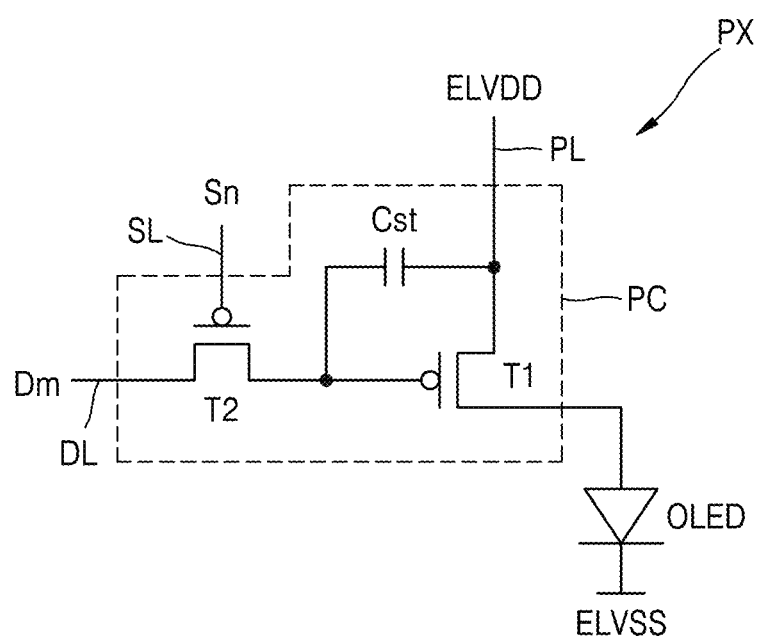
FIGS. 2A and 2B show equivalent circuit diagrams of a pixel included in a display device according to an embodiment.
Figure 2B:
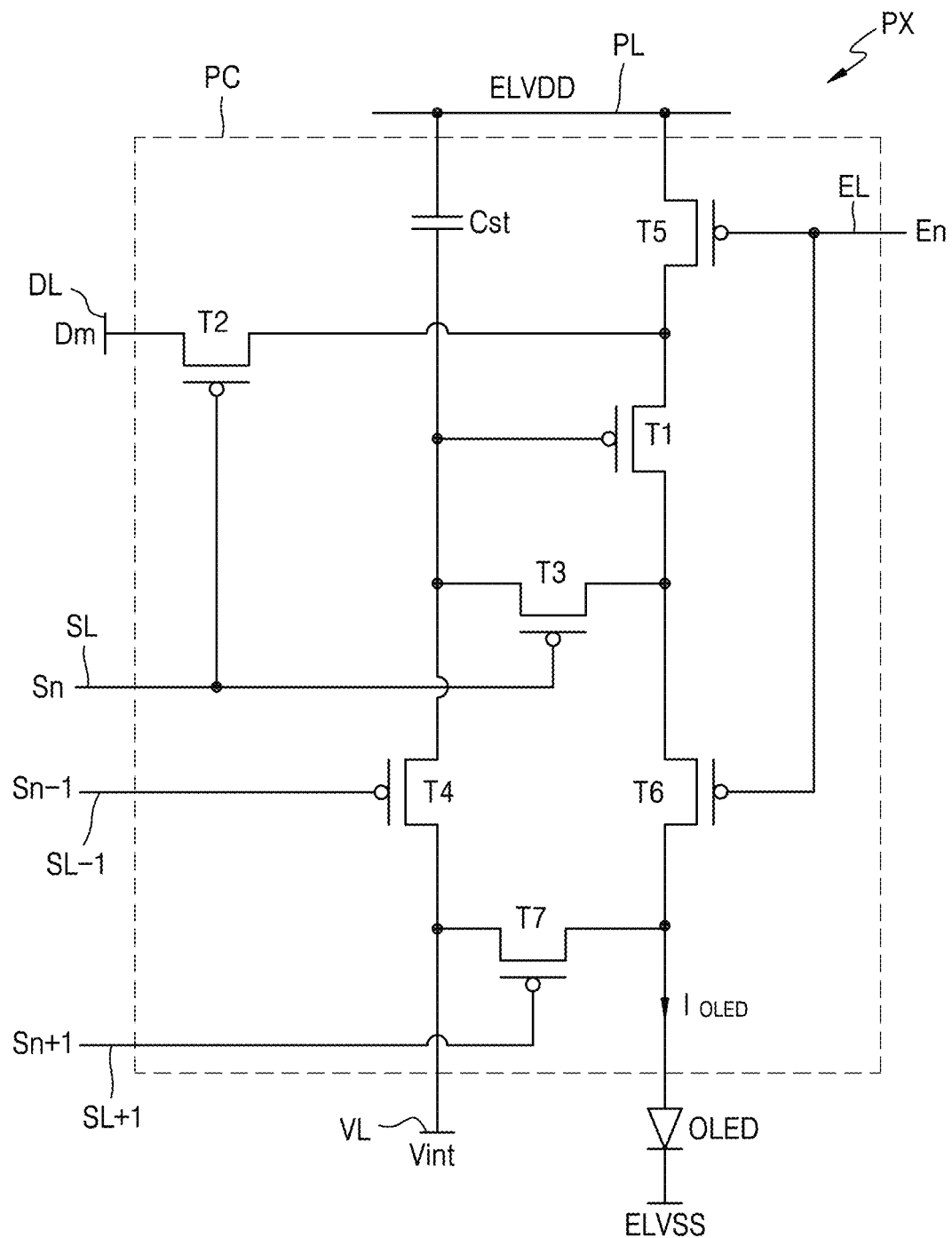

FIGS. 2A and 2B show equivalent circuit diagrams of a pixel PX included in a display device according to an embodiment.

Referring to FIG. 2A, an embodiment of the pixel PX may include a pixel circuit PC and a display element connected to the pixel circuit PC, for example, an organic light-emitting diode OLED. The pixel circuit PC may include a driving thin-film transistor T1, a switching thin-film transistor T2, and a storage capacitor Cst. Each pixel PX may emit red, green or blue light, or emit red, green, blue or white light, from the organic light-emitting diode OLED.

The switching thin-film transistor T2 may be connected to a scan line SL and a data line DL, and the switching thin-film transistor T2 may transfer a data voltage or a data signal Dm input from the data line DL to the driving thin-film transistor T1, in response to a scan voltage or scan signal Sn input through the scan line SL. The storage capacitor Cst is connected to the switching thin-film transistor T2 and a driving voltage line PL, and may store a voltage corresponding to the difference between the voltage transferred from the switching thin-film transistor T2 and a first power voltage ELVDD supplied to the driving voltage line PL.

The driving thin-film transistor T1 is connected to the driving voltage line PL and the storage capacitor Cst, and may control a driving current flowing through the organic light-emitting diode OLED from the driving voltage line PL based on the voltage value stored in the storage capacitor Cst. The organic light-emitting diode OLED may emit light having a certain luminance corresponding to driving current. A counter electrode (for example, a cathode) of the organic light-emitting diode OLED may receive a second power voltage ELVSS.

Referring to FIG. 2B, an alternative embodiment of the pixel circuit PC may include the driving thin-film transistor T1, the switching thin-film transistor T2, a compensation thin-film transistor T3, a first initialization thin-film transistor T4, an operation control thin-film transistor T5, a luminance control thin-film transistor T6, and a second initialization thin-film transistor T7.

In an embodiment, as shown in FIG. 2B, signal lines SL, SL−1, SL+1, EL, DL, an initialization voltage line VL, and a driving voltage line PL are provided for each pixel circuit PC. However, in an alternative embodiment, at least one of the signal lines SL, SL−1, SL+1, EL, DL, or/and the initialization voltage line VL may be shared by neighboring pixel circuits.

A driving drain electrode of the driving thin-film transistor T1 may be electrically connected to the organic light-emitting diode OLED via the luminance control thin-film transistor T6. The driving thin-film transistor T1 may receive the data signal Dm based on the switching operation of the switching thin-film transistor T2 and supply a driving current $I_{OLED}$ to the organic light-emitting diode OLED.

A switching gate electrode of the switching thin-film transistor T2 may be connected to the scan line SL, and a switching source electrode of the switching thin-film transistor T2 may be connected to the data line DL. The switching drain electrode of the switching thin-film transistor T2 may be connected to a source electrode of the driving thin-film transistor T1, and may be connected to the driving voltage line PL through the operation control thin-film transistor T5.

The switching thin-film transistor T2 may perform a switching operation in such a manner that the switching thin-film transistor T2 is turned on in response to the scan signal Sn transferred through the scan line SL and transfers the data signal Dm transferred through the data line DL to a driving source electrode of the driving thin-film transistor T1.

A compensation gate electrode of the compensation thin-film transistor T3 may be connected to the scan line SL. A compensation source electrode of the compensation thin-film transistor T3 may be connected to the driving drain electrode of the driving thin-film transistor T1, and connected to a pixel electrode of the organic light-emitting diode OLED through the luminance control thin-film transistor T6. A compensation drain electrode of the compensation thin-film transistor T3 may be connected to one electrode of the storage capacitor Cst, a first initialization source electrode of the first initialization thin-film transistor T4, and a driving gate electrode of the driving thin-film transistor T1. The compensation thin-film transistor T3 may be turned on in response to the scan signal Sn transferred through the scan line SL to connect the driving gate electrode of the driving thin-film transistor T1 with the driving drain electrode thereof, thereby providing a diode-connection of the driving thin-film transistor T1.

A first initialization gate electrode of the first initialization thin-film transistor T4 may be connected to a previous scan line SL−1. A first initialization drain electrode of the first initialization thin-film transistor T4 may be connected to an initialization voltage line VL. A first initialization source electrode of the first initialization thin-film transistor T4 may be connected to any one electrode of the storage capacitor Cst, the compensation drain electrode of the compensation thin-film transistor T3, and the driving gate electrode of the driving thin-film transistor T1. The first initialization thin-film transistor T4 may perform an initialization process in such a way that the first initialization thin-film transistor T4 is turned on in response to a previous scan signal Sn−1 transferred through the previous scan line SL−1, and transfers an initialization voltage Vint to the driving gate electrode of the driving thin-film transistor T1 to initialize the voltage of the driving gate electrode of the driving thin-film transistor T1.

An operation control gate electrode of the operation control thin-film transistor T5 may be connected to a luminance control line EL. An operation control source electrode of the operation control thin-film transistor T5 may be connected to the driving voltage line PL. An operation control drain electrode of the operation control thin-film transistor T5 may be connected to the driving source electrode of the driving thin-film transistor T1 and a switching drain electrode of the switching thin-film transistor T2.

A luminance control gate electrode of the luminance control thin-film transistor T6 may be connected to the luminance control line EL. A luminance control source electrode of the luminance control thin-film transistor T6 may be connected to the driving drain electrode of the driving thin-film transistor T1 and the compensation source electrode of compensation thin-film transistor T3. A luminance control drain electrode of the luminance control thin-film transistor T6 may be electrically connected to the pixel electrode of the organic light-emitting diode OLED. The operation control thin-film transistor T5 and the luminance control thin-film transistor T6 may be simultaneously turned on, in response to the luminance control signal En transferred through the luminance control line EL, so that the first power voltage ELVDD is transferred to the organic light-emitting diode OLED and the driving current $I_{OLED}$ flows in the organic light-emitting diode OLED.

A second initialization gate electrode of the second initialization thin-film transistor T7 may be connected to a next (or subsequent) scan line SL+1. A second initialization source electrode of the second initialization thin-film transistor T7 may be connected to the pixel electrode of the organic light-emitting diode OLED. The second initialization drain electrode of the second initialization thin-film transistor T7 may be connected to the initialization voltage line VL. The second initialization thin-film transistor T7 is turned on, in response to a next (or subsequent) scan signal Sn+1 transferred through the next scan line SL+1, to initialize the pixel electrode of the organic light-emitting diode OLED.

In an embodiment, as shown in FIG. 2B, the first initialization thin-film transistor T4 and the second initialization thin-film transistor T7 are connected to the previous scan line SL−1 and the next scan line SL+1, respectively. However, in an alternative embodiment, the first initialization thin-film transistor T4 and the second initialization thin-film transistor T7 may each be connected to the previous scan line SL−1 and driven in response to the previous scan signal Sn−1.

The other electrode of the storage capacitor Cst may be connected to the driving voltage line PL. An electrode of the storage capacitor Cst may be connected to the driving gate electrode of the driving thin-film transistor T1, the compensation drain electrode of the compensation thin-film transistor T3, and the first initialization source electrode of the first initialization thin-film transistor T4.

The counter electrode (for example, cathode) of the organic light-emitting diode OLED may receive the second power voltage ELVSS. The organic light-emitting diode OLED may receive the driving current $I_{OLED}$ from the driving thin-film transistor T1 and emit light.

The number and circuit design of the thin-film transistors and the storage capacitor of the pixel circuit PC are not limited to those described with reference to FIGS. 2A and 2B, and the number and the circuit design thereof may be variously modified.

An operation of each pixel PX according to an embodiment will hereinafter be described in detail.

In an embodiment, during an initialization period, the first initialization thin-film transistor T4 may be turned on in response to the previous scan signal Sn−1 through the previous scan line SL−1, and the driving thin-film transistor T1 may be initialized due to an initialization voltage Vint supplied through the initialization voltage line VL.

During a data programming period, when the scan signal Sn is supplied through the scan line SL, the switching thin-film transistor T2 and the compensation thin-film transistor T3 may be turned on in response to the scan signal Sn. Accordingly, the driving thin-film transistor T1 may be diode-connected by the compensation thin-film transistor T3 that has been turned on, and may be biased forward.

When the driving thin-film transistor T1 is diode-connected, a compensation voltage (Dm+Vth, and Vth denotes a threshold voltage having a negative value), which is less than the data signal Dm supplied through the data line DL by the threshold voltage (Vth) of the driving thin-film transistor T1, may be applied to a gate electrode of the driving thin-film transistor T1.

The first power voltage ELVDD and the compensation voltage (Dm+Vth) are applied to opposite ends of the storage capacitor Cst, respectively, and a charge corresponding to the voltage difference between the opposite ends of the storage capacitor Cst may be stored therein.

During a luminance period, the operation control thin-film transistor T5 and the luminance control thin-film transistor T6 may be turned on in response to the luminance control signal En supplied through the luminance control line EL. The driving current $I_{OLED}$ may flow based on the voltage difference between the driving gate electrode of the driving thin-film transistor T1 and the first power voltage ELVDD, and the driving current $I_{OLED}$ may be supplied to the organic light-emitting diode OLED through the luminance control thin-film transistor T6.

Figure 3:
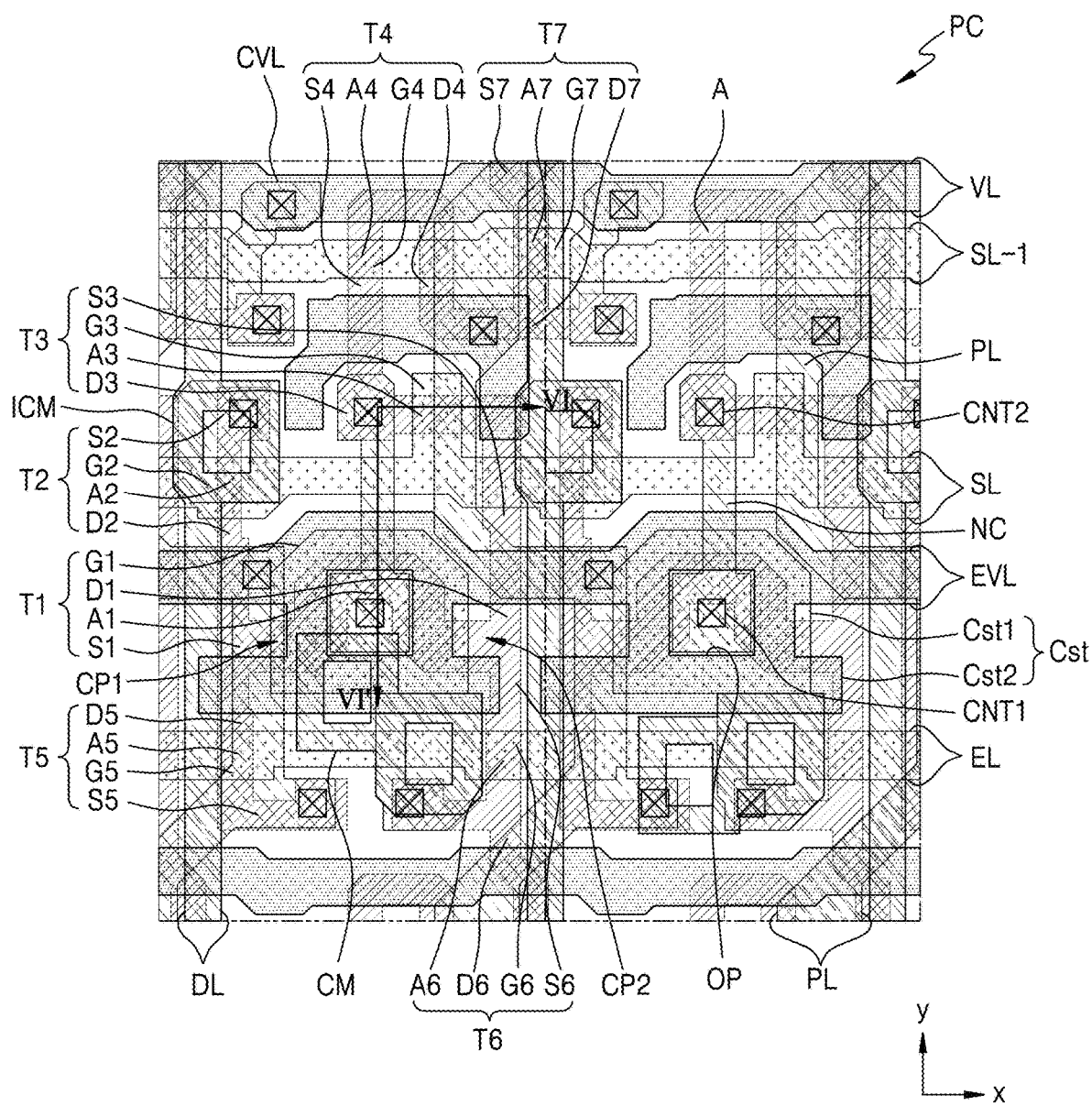
FIG. 3 shows a plan view of a pixel circuit according to an embodiment.

FIG. 3 shows a plan view of the pixel circuit PC according to an embodiment.

Referring to FIG. 3, an embodiment of the pixel circuit PC may include at least one thin-film transistor. In one embodiment, for example, the pixel circuit PC may include the driving thin-film transistor T1, the switching thin-film transistor T2, the compensation thin-film transistor T3, the first initialization thin-film transistor T4, the operation control thin-film transistor T5, the luminance control thin-film transistor T6, and the second initialization thin-film transistor T7. At least one thin-film transistor may be arranged along the semiconductor layer A. The semiconductor layer A may be disposed on a substrate, on which a buffer layer including an inorganic insulating material is disposed.

Some areas of the semiconductor layer A may correspond to semiconductor layers of the driving thin-film transistor T1, the switching thin-film transistor T2, the compensation thin-film transistor T3, the first initialization thin-film transistor T4, the operation control thin-film transistor T5, the luminance control thin-film transistor T6, and the second initialization thin-film transistor T7. In such an embodiment, semiconductor layers of the driving thin-film transistor T1, the switching thin-film transistor T2, the compensation thin-film transistor T3, the first initialization thin-film transistor T4, the operation control thin-film transistor T5, the luminance control thin-film transistor T6, and the second initialization thin-film transistor T7 may be connected together and may be curved in various shapes.

The semiconductor layer A may include a channel area, and a source area and a drain area on opposite sides of the channel area. The source area and the drain area may define a source electrode and a drain electrode of a corresponding thin-film transistor. Hereinafter, for convenience of description, the source electrode and the drain electrode will be referred to as a source area and a drain area, respectively.

The driving thin-film transistor T1 may include a driving gate electrode G1 overlapping a driving channel area A1, and a driving source area S1 and a driving drain area D1 on opposite sides of the driving channel area A1. The driving channel area A1 overlapping the driving gate electrode G1 has a shape such as an omega shape or a horseshoe shape, thereby maintaining a long channel length in a narrow or limited space. If the driving channel area A1 is long in length, the driving range of the gate voltage is widened, so that gradation of light emitted from the organic light-emitting diode OLED may be more precisely controlled, and display quality may be improved.

The switching thin-film transistor T2 may include a switching gate electrode G2 overlapping the switching channel area A2 and a switching source area S2 and a switching drain area D2 on opposite sides of the switching channel area A2. The switching drain area D2 may be connected to the driving source area S1.

The compensation thin-film transistor T3 may include a compensation gate electrode G3 overlapping a compensation channel area A3, and a compensation source area S3 and a compensation drain area D3 on opposite sides of the compensation channel area A3. In an embodiment, the compensation thin-film transistor T3 may be a dual thin-film transistor, and may include compensation gate electrodes G3 overlapping two compensation channel areas A3. The compensation thin-film transistor T3 may be connected to the driving gate electrode G1 of the driving thin-film transistor T1 through a node connection line NC, which will be described later.

The first initialization thin-film transistor T4 may include a first initialization gate electrode G4 overlapping a first initialization channel area A4, and a first initialization source area S4 and a first initialization drain area D4 on opposite sides of the first initialization channel area A4. In an embodiment, as shown in FIG. 3, the first initialization thin-film transistor T4 may be a dual thin-film transistor, and may include first initialization gate electrodes G4 overlapping two first initialization channel areas A4. The first initialization source area S4 may be connected to the compensation drain area D3.

The operation control thin-film transistor T5 may include an operation control gate electrode G5 overlapping an operation control channel area A5, and an operation control source area S5 and an operation control drain area D5 placed on opposite sides of the operation control channel area A5. The operation control drain area D5 may be connected to the driving source area S1. The operation control drain area D5 may be connected to the switching drain area D2.

The luminance control thin-film transistor T6 may include a luminance control gate electrode G6 overlapping the luminance control channel area A6, and a luminance control source area S6 and a luminance control drain area D6 placed on opposite sides of the luminance control channel area A6. The luminance control source area S6 may be connected to the driving drain area D1. The luminance control source area S6 may be connected to the compensation source area S3.

The second initialization thin-film transistor T7 may include a second initialization gate electrode G7 overlapping a second initialization channel area A7 and a second initialization source area S7 and a second initialization drain area D7 placed on opposite sides of the second initialization gate electrode G7. The second initialization drain area D7 may be connected to the first initialization drain area D4. The second initialization source area S7 may be connected to the luminance control drain area D6.

The thin-film transistors described above may be connected to the signal lines SL, SL−1, EL, and DL, the initialization voltage line VL, and the driving voltage line PL.

The scan line SL, the previous scan line SL−1, the luminance control line EL, and the driving gate electrode G1 may be disposed on the semiconductor layer A with at least one insulating layer therebetween.

The scan line SL may extend in a first direction (for example, an x direction or a −x direction). Portions of the scan line SL may correspond to the switching gate electrode G2 and the compensation gate electrode G3. In one embodiment, for example, a portion of the scan line SL overlapping the switching channel area A2 may define the switching gate electrode G2. In such an embodiment, a portion of the scan line SL overlapping the compensation channel area A3 may define the compensation gate electrode G3.

The previous scan line SL−1 extends in the first direction (for example, the x direction or the −x direction), and portions of the previous scan line SL−1 may correspond to the first initialization gate electrode G4 and the second initialization gate electrode G7. In one embodiment, for example, a portion of the previous scan line SL−1 overlapping the first initialization channel area A4 may define the first initialization gate electrode G4. In such an embodiment, a portion of the previous scan line SL−1 overlapping the second initialization channel area A7 may define the second initialization gate electrode G7.

The luminance control line EL may extend in the first direction (for example, the x direction or the −x direction). Portions of the luminance control line EL may correspond to the operation control gate electrode G5 and the luminance control gate electrode G6. In an embodiment, a portion of the luminance control line EL overlapping the operation control channel area A5 may define an operation control gate electrode G5. In such an embodiment, a portion of the luminance control line EL overlapping the luminance control channel area A6 may define the luminance control gate electrode G6.

In an embodiment, the scan line SL, the previous scan line SL−1, and the luminance control line EL may include a same material as each other.

The driving gate electrode G1 may be connected to the compensation thin-film transistor T3 through a node connection line NC.

The initialization voltage line VL and an electrode voltage line EVL may be disposed on at least one insulating layer covering the scan line SL, the previous scan line SL−1, the luminance control line EL, and the driving gate electrode G1.

The electrode voltage line EVL may extend in the first direction (for example, the x direction or the −x direction). The electrode voltage line EVL covers the driving gate electrode G1, and may constitute a storage capacitor Cst together with the driving gate electrode G1. In an embodiment, the storage capacitor Cst may include a lower electrode Cst1 and an upper electrode Cst2, where the lower electrode Cst1 may be defined by a driving gate electrode G1, and the upper electrode Cst2 may be defined by a portion of the electrode voltage line EVL. In such an embodiment, the lower electrode Cst1 may be integrally formed with the driving gate electrode G1 as a single unitary unit. In such an embodiment, the length of the driving channel area A1 is increased, such that the area of the lower electrode Cst1 as the driving gate electrode G1 may be widened. In such an embodiment, it is desired to maintain the capacity of the capacitor Cst. Accordingly, in an embodiment, the upper electrode Cst2 may have a first recessed portion CP1 and a second recessed portion CP2 exposing the edge of the lower electrode Cst1 on a plane. This will be described later in detail with reference to FIG. 4.

In an embodiment, a simple closed curve-shaped opening OP may be defined through the upper electrode Cst2. Here, the simple closed curve refers to a closed figure having a same start point and end point when a point is drawn on a straight line or a curve such as a polygon, circle, ellipse, or the like. The opening OP may expose the central portion of the lower electrode Cst1.

The electrode voltage line EVL may be electrically connected to the driving voltage line PL. In such an embodiment, at least one insulating layer may be disposed between the electrode voltage line EVL and the driving voltage line PL, and the electrode voltage line EVL and the driving voltage line PL may be connected to each other through a contact hole of the at least one insulating layer. Therefore, the upper electrode Cst2 may have a same voltage level (constant voltage) as the driving voltage line PL. In one embodiment, for example, the electrode voltage line EVL may have a constant voltage, e.g., about +5 volt (V). Therefore, the driving voltage line PL and the electrode voltage line EVL may form a mesh structure and may provide a first power voltage to each pixel circuit PC.

In an embodiment, the electrode voltage line EVL and the driving voltage line PL are disposed in different layers from each other, and the resistivity of the electrode voltage line EVL may be significantly greater than that of the driving voltage line PL.

In an embodiment, the initialization voltage line VL may be disposed in the first direction (for example, the x direction or the −x direction). The initialization voltage line VL may be connected to the first initialization thin-film transistor T4 and the second initialization thin-film transistor T7 through an initialization connection line CVL, which will be described later. The initialization voltage line VL may have a constant voltage (for example, about −2 V).

The electrode voltage line EVL and the initialization voltage line VL may be disposed in a same layer as each other and may include a same material as each other.

At least one insulating layer may be disposed on the electrode voltage line EVL, and the driving voltage line PL, the initialization connection line CVL, and the node connection line NC may be disposed on the at least one insulating layer.

The driving voltage line PL may extend in a second direction crossing the first direction. In one embodiment, for example, the second direction and the first direction may form an acute angle. In an alternative embodiment, the second direction and the first direction may form an obtuse angle or a right angle. Hereinafter, for convenience of description, embodiments where the second direction is perpendicular to the first direction will be described in detail. In an embodiment, the driving voltage line PL may extend substantially in the second direction (for example, a y direction or a −y direction). In an embodiment, the driving voltage line PL may include a curved shape. In an embodiment, the driving voltage line PL may extend in a second direction (for example, the y direction or the −y direction). Herein, a z direction (shown in FIG. 1), which are perpendicular to the x direction and the y direction, may be a thickness direction of the display device 1.

The driving voltage line PL may be electrically connected to the electrode voltage line EVL through a contact hole. In such an embodiment, the driving voltage line PL may be connected to the operation control source area S5 through a contact hole.

One end of the initialization connection line CVL may be connected to the first initialization thin-film transistor T4 and/or the second initialization thin-film transistor T7 through a contact hole, and another end of the initialization connection line CVL may be connected to the initialization voltage line VL through a contact hole.

One end of the node connection line NC may be connected to the driving gate electrode G1 through a first contact hole CNT1, and another end of the node connection line NC may be connected to the compensation drain area D3 through a second contact hole CNT2.

In an embodiment, the driving voltage line PL and the node connection line NC may include a same material as each other.

At least one insulating layer may be disposed on the driving voltage line PL, the initialization connection line CVL and the node connection line NC, and the data line DL and a connection electrode CM may be disposed on the at least one insulating layer.

The data line DL may extend in the second direction (for example, the y direction or the −y direction). The data line DL may be connected to the switching source area S2 through an intermediate connection electrode ICM. A portion of the data line DL may be understood as a switching source electrode.

FIG. 3 shows an embodiment where the data line DL and the driving voltage line PL are disposed in different layers from each other. However, in an alternative embodiment, the data line DL and the driving voltage line PL are disposed in a same layer as each other.

The connection electrode CM may connect the pixel electrode of the organic light-emitting diode with the luminance control thin-film transistor T6. The connection electrode CM and the data line DL may include a same material as each other.

Figure 4:
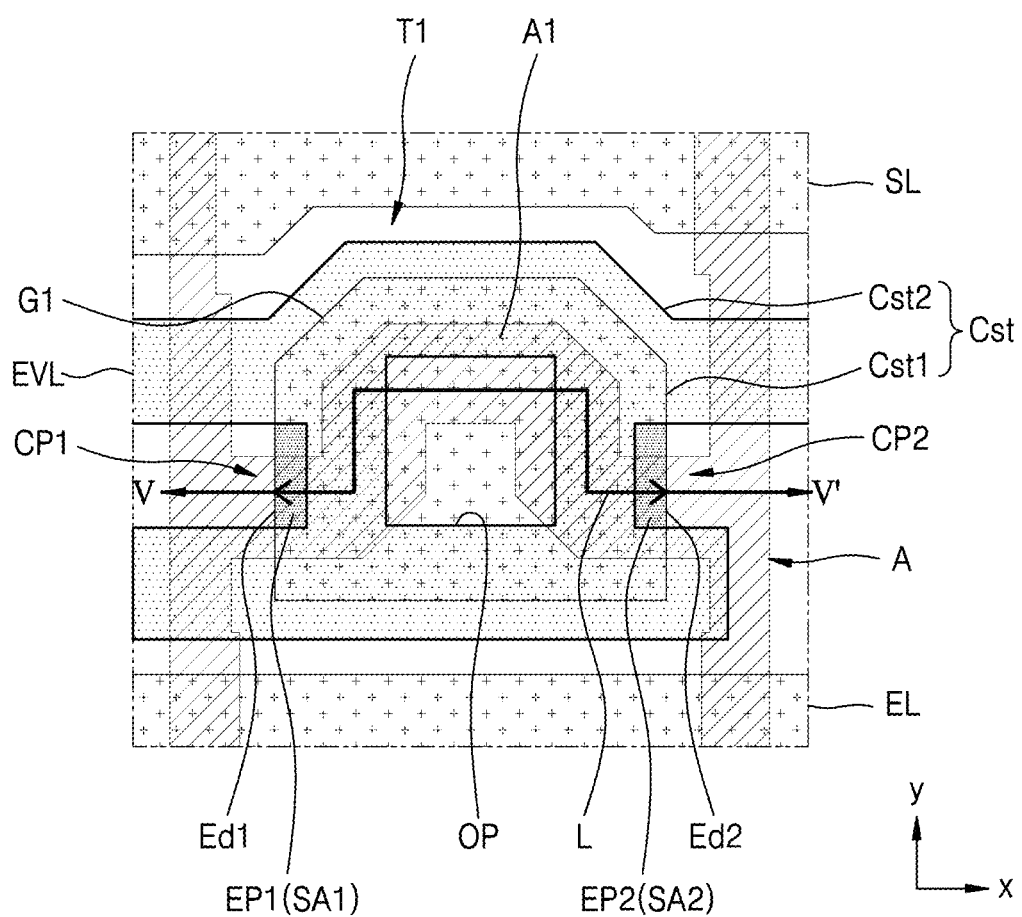
FIG. 4 shows a plan view schematically illustrating a storage capacitor according to an embodiment.

FIG. 4 shows a plan view schematically illustrating the storage capacitor Cst according to an embodiment.

Referring to FIG. 4, an embodiment of a pixel circuit may include, on a substrate, the driving thin-film transistor T1 including the semiconductor layer A including the driving channel area A1 and the driving gate electrode G1 overlapping the driving channel area A1, and a storage capacitor Cst including the lower electrode Cst1 disposed on the driving channel area A1 and the upper electrode Cst2 with an opening OP, which is single closed curve-shaped, overlapping the lower electrode Cst1. In an embodiment, the scan line SL and the luminance control line EL may extend in the first direction (for example, the x direction or the −x direction). In such an embodiment, the driving channel area A1 may include a curved shape.

The upper electrode Cst2 may include the first recessed portion CP1 and the second recessed portion CP2, each exposing an edge of the lower electrode Cst1 on a plane (for example, an xy plane). Herein, "on a plane" may mean "when viewed from a plan view in a direction perpendicular to the xy plane (i.e., the z direction or the thickness direction of the display device 1)". Therefore, at least some of the edge of the lower electrode Cst1 may not overlap the upper electrode Cst2 due to the first recessed portion CP1 and/or the second recessed portion CP2. Herein, a recessed portion of the upper electrode Cst2 is a region in which at least one point on a line segment connecting any two points of a plane surface of the upper electrode Cst2 (for example, an xy plane) is not included in the upper electrode Cst2.

In an embodiment, the first recessed portion CP1 and the second recessed portion CP2 may be disposed in parallel to each other in one direction. In one embodiment, for example, the first recessed portion CP1 and the second recessed portion CP2 may be disposed in parallel to each other in the first direction (for example, the x direction or the −x direction). In an embodiment, the first recessed portion CP1 and the second recessed portion CP2 may be disposed in parallel to each other in the second direction (for example, the y direction or the −y direction).

In an embodiment, the upper electrode Cst2 may further include a third recessed portion and a fourth recessed portion, each exposing the edge of the lower electrode Cst1 on a plane. In such an embodiment, the first recessed portion CP1 and the second recessed portion CP2 may be disposed in parallel to each other in the first direction (for example, the x direction or the −x direction), and the third recessed portion and the fourth recessed portion may be disposed in parallel to each other in the second direction (for example, the y direction or the −y direction). Hereinafter, for convenience of description, embodiments where the first recessed portion CP1 and the second recessed portion CP2 are arranged in parallel to each other in a direction on the upper electrode Cst2 as shown in FIG. 4 will be described in detail.

In an embodiment, the first recessed portion CP1 and the second recessed portion CP2 may be disposed on opposite sides based on the opening OP. In one embodiment, for example, on a plane (for example, the xy plane), the first recessed portion CP1 is disposed in the −x direction relative to the center of the lower electrode Cst1, and the second recessed portion CP2 may be disposed in the x direction relative to the center of the lower electrode Cst1.

The first recessed portion CP1 may expose a first edge portion EP1 of the lower electrode Cst1. In such an embodiment, the second recessed portion CP2 may expose a second edge portion EP2 of the lower electrode Cst1. Herein, an edge portion of the lower electrode Cst1 refers to a region of the lower electrode Cst1 including an edge of the lower electrode Cst1 on a plane.

The first edge portion EP1 and the second edge portion EP2 may be disposed in parallel to each other in one direction. In one embodiment, for example, the first edge portion EP1 and the second edge portion EP2 may be disposed in parallel to each other in the first direction (for example, the x direction or the −x direction). In such an embodiment, the first edge portion EP1 and the second edge portion EP2 may be disposed in parallel to each other in the second direction (for example, they direction or the −y direction).

A first edge length Ed1 of the first edge portion EP1 exposed by the first recessed portion CP1 may be the same as a second edge length Ed2 of the second edge portion EP2 exposed by the second recessed portion CP2. In one embodiment, for example, the first edge length Ed1 of the first edge portion EP1 in the second direction (for example, the y direction or the −y direction) may be the same as the second edge length Ed2 of the second edge portion EP2 in the second direction (for example, the y direction or the −y direction).

In an embodiment, the sum of the area SA1 of the first edge portion EP1 and the area SA2 of the second edge portion EP2 may be constant or have a predetermined value. In such an embodiment, the area SA1 of the first edge portion EP1 is the size of the first edge portion EP1 exposed by the first recessed portion CP1 on a plane, and the area SA2 of the second edge portion EP2 is the size of the second edge portion EP2 exposed by the second recessed portion CP2 on a plane.

In an embodiment, at least one of the first edge portion EP1 and the second edge portion EP2 may overlap the driving channel area A1. In one embodiment, for example, the first edge portion EP1 and the second edge portion EP2 may be disposed in parallel to each other in the first direction (for example, the x direction or the −x direction), and the first edge portion EP1 and the second edge portion EP2 may overlap the driving channel area A1 having a curved shape.

In an embodiment, the upper electrode Cst2 may include the first recessed portion CP1 and the second recessed portion CP2, each exposing the edge of the lower electrode Cst1, and the driving channel area A1 may include a curved shape. Therefore, the length L of the driving channel area A1 may be maintained long in a narrow space, and the change in the current flowing through the driving thin-film transistor T1 due to the change in voltage may be reduced. In such an embodiment, the voltage may be a voltage difference between the driving gate electrode G1 and a first power voltage (ELVDD, see FIG. 2B). Accordingly, the gradation of light emitted from the organic light-emitting diode OLED may be precisely controlled.

In such an embodiment, as the length L of the driving channel area A1 is increased, the area of the storage capacitor Cst may also be increased. Accordingly, the capacity of the storage capacitor Cst may be increased. In such an embodiment, the area of the storage capacitor Cst may be defined as the area where the lower electrode Cst1 and the upper electrode Cst2 overlap each other. According to an embodiment, the upper electrode Cst2 may include the first recessed portion CP1 and the second recessed portion CP2, each exposing the edge of the lower electrode Cst1, and thus, the area of the storage capacitor Cst may be effectively prevented from increasing due the increased driving channel area A1, and the capacity of the storage capacitor Cst may be effectively maintained even when the length L of the driving channel area A1 is increased.

In such an embodiment, the first edge length Ed1 of the first edge portion EP1 may be the same as the second edge length Ed2 of the second edge portion EP2, and the sum of the area SA1 of the first edge portion EP1 and the area of the second edge portion EP2 may be maintained constant. Therefore, even when an overlay deviation in the first direction (for example, the x direction or the −x direction) that may occur during the manufacturing process of a display device occurs, the change in the capacitor of the storage capacitor Cst may be effectively reduced without increasing the data voltage for full black gradation.

Figure 5:
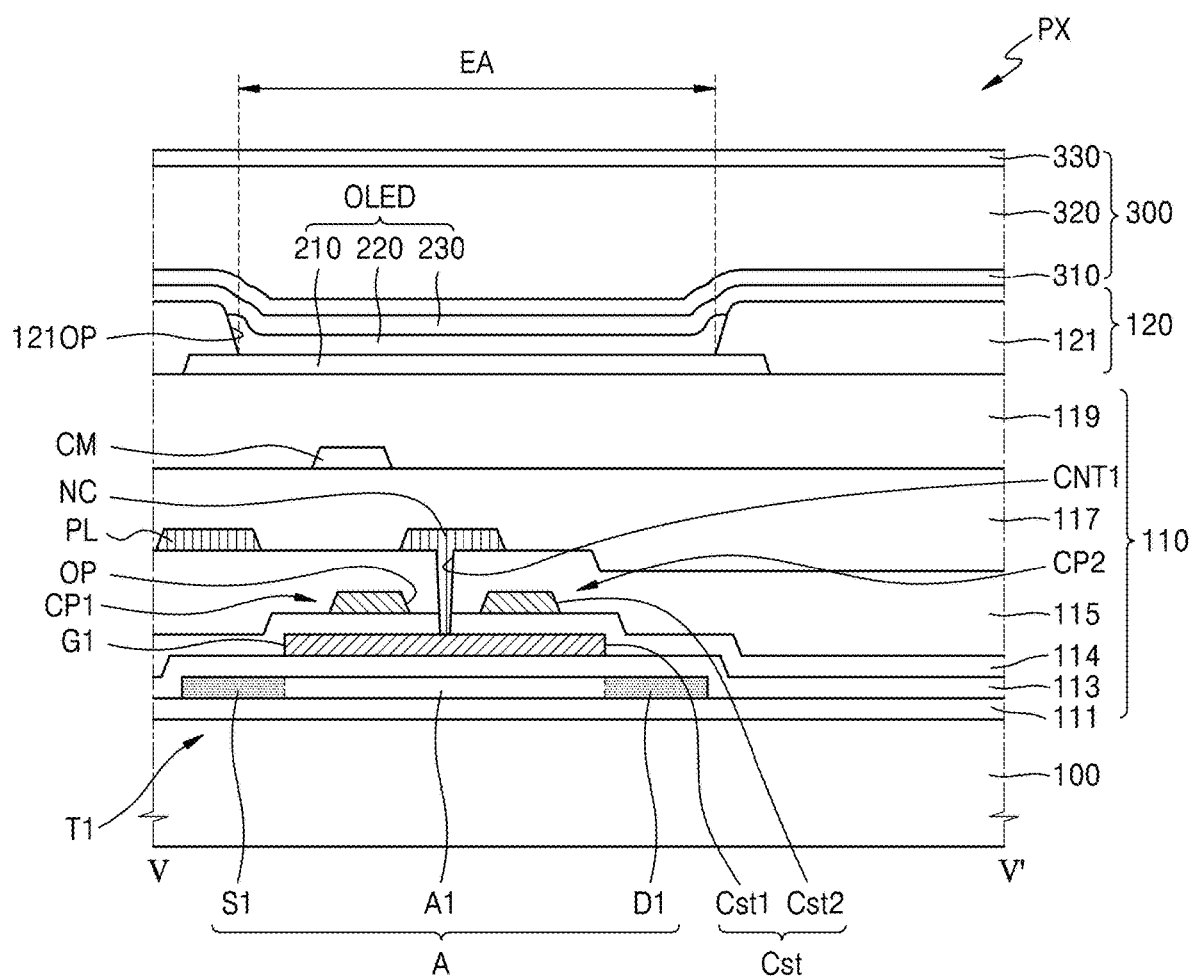
FIGS. 5 and 6 show cross-sectional views schematically illustrating a pixel of a display device according to an embodiment.
Figure 6:
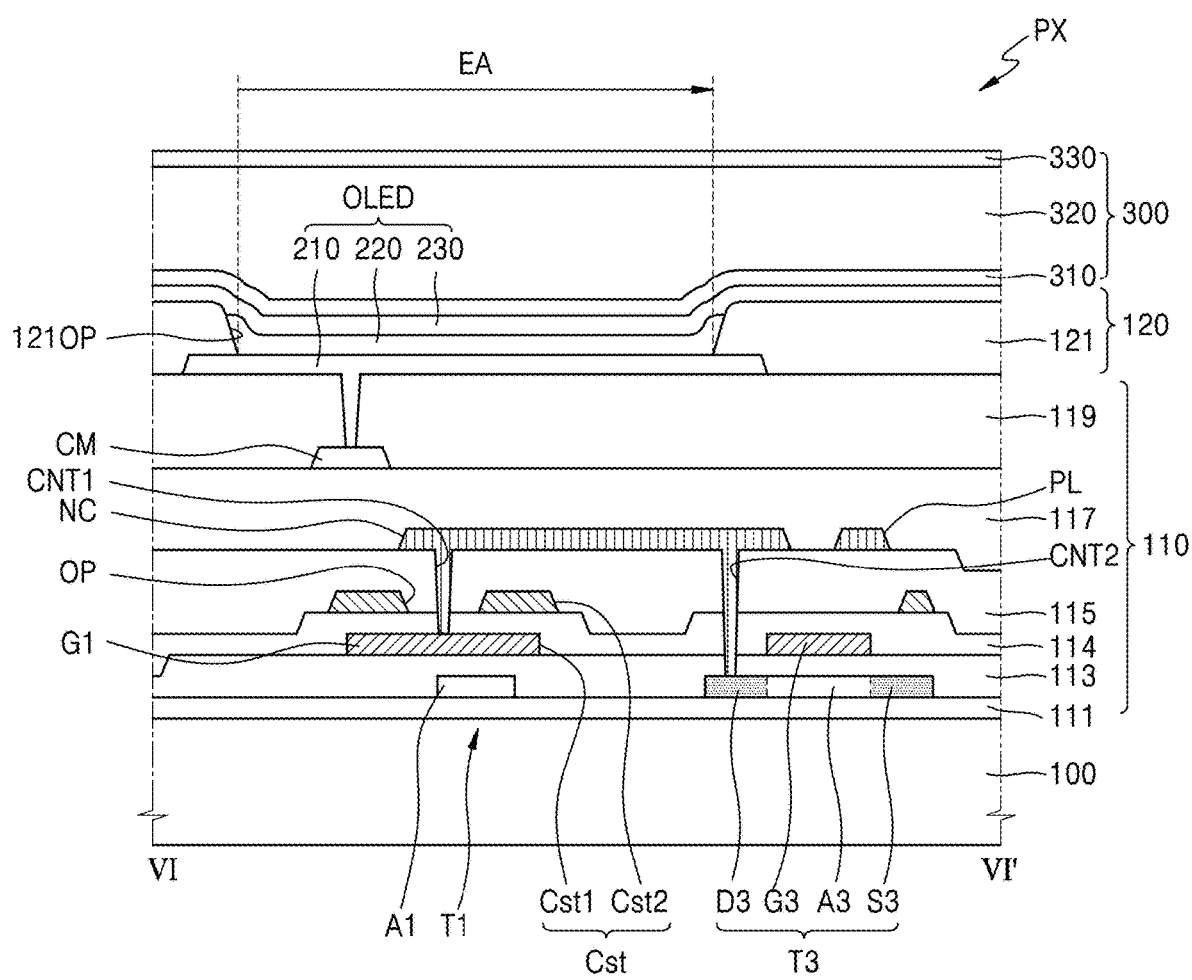

FIGS. 5 and 6 show cross-sectional views schematically illustrating the pixel PX of a display device according to an embodiment. FIG. 5 may correspond to line V-V of FIG. 4. FIG. 6 may correspond to line VI-VI' of FIG. 3. Referring to FIGS. 5 and 6, the same reference symbols as those in FIG. 3 denote the same elements, and any repetitive detailed description thereof will be omitted.

Referring to FIGS. 5 and 6, in an embodiment, the pixel PX may include at least one thin-film transistor, a storage capacitor Cst, and an organic light-emitting diode OLED, which is a display element, on the substrate 100. A thin-film transistor may include a semiconductor layer including a channel area and a gate electrode overlapping the channel area, and the storage capacitor Cst may include the lower electrode Cst1 disposed on the channel area and the upper electrode Cst2 with a single closed curve-shaped opening OP and disposed on the lower electrode Cst1. In such an embodiment, on a plane, the upper electrode Cst2 may include the first recessed portion CP1 and the second recessed portion CP2, each exposing the edge of the lower electrode Cst1.

Hereinafter, a structure in which a thin-film transistor, a storage capacitor Cst, and an organic light-emitting diode OLED are stacked will be described in detail. A pixel circuit layer 110, a display element layer 120, and a thin-film encapsulation layer 300 may be stacked on the substrate 100. The pixel circuit layer 110 may include a pixel circuit connected to an organic light-emitting diode OLED and insulating layers. The pixel circuit layer 110 may include a plurality of thin-film transistors and a plurality of storage capacitors, and insulating layers disposed therebetween. The display element layer 120 may include display elements, for example, the organic light-emitting diode OLED. In such an embodiment, the substrate 100 and the pixel circuit layer 110 may collectively define a thin-film transistor array substrate.

The substrate 100 may include a polymer resin, such as polyethersulfone, polyarylate, polyetherimide, polyethylene naphthalate, polyethylene terephthalate, polyphenylene sulfide, polyimide, polycarbonate, cellulose triacetate ("TAO"), cellulose acetate propionate, or the like, for example.

A barrier layer (not shown) may be further included on the pixel circuit layer 110 and the substrate 100. The barrier layer is a layer that prevents penetration of foreign substances, and may be a single layer or a multi-layer including inorganic materials such as silicon nitride ($SiN_X$) and silicon oxide ($SiO_X$).

A buffer layer 111 may include an inorganic insulating material such as silicon nitride, silicon oxynitride and silicon oxide, for example, and may be a single layer or multi-layer including the above-described inorganic insulating material.

The semiconductor layer A may be disposed on the buffer layer 111. FIG. 5 shows the driving channel area A1, the driving source area S1, and the driving drain area D1 of the driving thin-film transistor T1, and FIG. 6 shows the driving channel area A1, the compensation channel area A3, the compensation source area S3, and the compensation drain area D3.

A first gate insulating layer 113 may cover the semiconductor layer A. The first gate insulating layer 113 may include an inorganic insulating material, such as silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), for example.

A gate electrode overlaps a channel area and may be disposed on the first gate insulating layer 113. In one embodiment, for example, the driving gate electrode G1 may overlap the driving channel area A1, and the compensation gate electrode G3 may overlap the compensation channel area A3.

A second gate insulating layer 114 may be provided to cover a gate electrode. The second gate insulating layer 114 may include an inorganic insulating material, such as $SiO_2$, $SiN_X$, SiON, $Al_2O_3$, $TiO_2$, $Ta_2O_5$, $HfO_2$, or $ZnO_2$, for example.

The upper electrode Cst2 of the storage capacitor Cst may be disposed on the second gate insulating layer 114. The upper electrode Cst2 may overlap the driving gate electrode G1 disposed thereunder. In such an embodiment, the driving gate electrode G1 and the upper electrode Cst2 overlapping the second gate insulating layer 114 disposed therebetween may form or collectively define the storage capacitor Cst. In such an embodiment, the driving gate electrode G1 may define or function as the lower electrode Cst1 of the storage capacitor Cst.

The upper electrode Cst2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may be a single layer or multiple layers, each layer including at least one selected from the aforementioned materials.

An insulating interlayer 115 may cover the upper electrode Cst2. The insulating interlayer 115 may include $SiO_2$, $SiN_X$, SiON, $Al_2O_3$, $TiO_2$, $Ta_2O_5$, $HfO_2$, or $ZnO_2$. The insulating interlayer 115 may be a single layer or multiple layers, each layer including the inorganic insulating material described above.

The driving voltage line PL and the node connection line NC may be disposed on the insulating interlayer 115. The node connection line NC may connect the driving gate electrode G1 with the compensation drain area D3 of the compensation thin-film transistor T3 through a contact hole. The driving gate electrode G1, which is of an island type, may be electrically connected to the compensation thin-film transistor T3 by the node connection line NC. In an embodiment where the driving gate electrode G1 functions as the lower electrode Cst1 of the storage capacitor Cst, the node connection line NC may be connected to the lower electrode Cst1.

One end of the node connection line NC may be connected to the lower electrode Cst1 through the first contact hole CNT1. The first contact hole CNT1 is disposed in the opening OP of the upper electrode Cst2 to connect one end of the node connection line NC to the lower electrode Cst1. The size of the opening OP is greater than the size of the first contact hole CNT1 so that the first contact hole CNT1 may be spaced apart from the upper electrode Cst2.

The other end of the node connection line NC may be connected to the compensation thin-film transistor T3 through the second contact hole CNT2. The second contact hole CNT2 may be defined or formed through the insulating interlayer 115, the second gate insulating layer 114, and the first gate insulating layer 113. The other end of the node connection line NC may be connected to the compensation drain area D3 of the compensation thin-film transistor T3.

At least one of the driving voltage line PL and the node connection line NC may include a conductive material including Mo, Al, Cu, Ti or the like, and may be formed as multiple layers or a single layer, each including at least one material selected from these materials. In one embodiment, for example, at least one selected from the driving voltage line PL and the node connection line NC may have a multilayer structure of Ti/Al/Ti.

A first planarization layer 117 may cover the driving voltage line PL and the node connection line NC. The first planarization layer 117 may include an organic insulating layer. The first planarization layer 117 may include an organic insulating material including a general purpose polymer such as polymethylmethacrylate ("PMMA") or polystyrene ("PS"), a polymer derivative having a phenolic group, or an acrylic polymer, an imide polymer, an aryl ether polymer, an amide polymer, a fluorine polymer, a p-xylene-based polymer, a vinyl alcohol-based polymer, or a combination (e.g., a blend) thereof.

The connection electrode CM may be disposed on the first planarization layer 117. The connection electrode CM may be connected to the organic light-emitting diode OLED. The connection electrode CM may include a conductive material including Mo, A1, Cu, Ti, etc., and may be formed as a multilayer or a single layer, each layer including at least one selected from these materials. In one embodiment, for example, the connection electrode CM may have a multilayer structure of Ti/Al/Ti.

A second planarization layer 119 may be disposed to cover the connection electrode CM. The second planarization layer 119 may include an organic insulating layer. The second planarization layer 119 may include an organic insulating material including a general purpose polymer such as PMMA or PS, a polymer derivative having a phenolic group, or an acrylic polymer, an imide polymer, an aryl ether polymer, an amide polymer, a fluorine polymer, a p-xylene-based polymer, a vinyl alcohol-based polymer, or a blend thereof.

The organic light-emitting diode OLED may be disposed on the second planarization layer 119. The organic light-emitting diode OLED may include a pixel electrode 210, an emission layer 220, and a counter electrode 230. The organic light-emitting diode OLED may emit red light, green light or blue light, or emit red light, green light, blue light or white light.

The pixel electrode 210 may be disposed on the second planarization layer 119. The pixel electrode 210 may be connected to the connection electrode CM through a contact hole of the second planarization layer 119. The pixel electrode 210 may include a conductive oxide, such as indium tin oxide ("ITO"), indium zinc oxide ("IZO"), zinc oxide (ZnO), indium oxide ($In_2O_3$), indium gallium oxide ("IGO"), and aluminum zinc oxide ("AZO"). In an embodiment, the pixel electrode 210 may include a reflective film including silver (Ag), magnesium (Mg), aluminum (A1), platinum (Pt), palladium (Pd), gold (Au), nickel (Ni), neodymium (Nd), iridium (Ir), chromium (Cr), or a compound thereof. In an embodiment, the pixel electrode 210 may further include a film including ITO, IZO, ZnO, or $In_2O_3$ above/under the reflective film.

A pixel defining layer 121, through which an opening 1210P exposing a central portion of the pixel electrode 210 is defined, may be disposed on the pixel electrode 210. The pixel defining layer 121 may include at least one selected from organic insulating materials and/or inorganic insulating materials. The opening 1210P may define a light-emitting area of the organic light-emitting diode OLED from which light is emitted (hereinafter, such a light-emitting area will be referred to as a light-emitting area EA). In one embodiment, for example, the width of an opening may correspond to the width of the light-emitting area EA.

The emission layer 220 may be disposed in the opening 1210P of the pixel defining layer 121. The emission layer 220 may include a high molecular weight or low molecular weight organic material that emits light of a certain color.

Although not shown, a first functional layer and a second functional layer may be disposed under and above the emission layer 220, respectively. The first functional layer may include, for example, a hole transport layer ("HTL") L and/or a hole injection layer ("HIL"). The second functional layer is a component disposed on the emission layer 220 and the use thereof may be optional. The second functional layer may include an electron transport layer ("ETL") and/or an electron injection layer ("EIL"). The first functional layer and/or the second functional layer may be a common layer formed to completely cover the substrate 100, as the counter electrode 230 to be described later.

The counter electrode 230 may include a conductive material having a low work function. In one embodiment, for example, the counter electrode 230 may include a (semi)transparent layer including silver (Ag), magnesium (Mg), aluminum (A1), platinum (Pt), palladium (Pd), gold (Au), nickel (Ni), neodymium (Nd), iridium (Ir), chromium (Cr), lithium (Li), calcium (Ca), or an alloy thereof. In an embodiment, the counter electrode 230 may further include a layer including ITO, IZO, ZnO, or $In_2O_3$ on the (semi) transparent layer containing the materials described above.

The display element layer 120 may be covered with an encapsulation member such as a thin-film encapsulation layer 300. The thin-film encapsulation layer 300 may include at least one inorganic encapsulation layer and at least one organic encapsulation layer, each covering the display element layer 120. In one embodiment, for example, the thin-film encapsulation layer 300 may include a first inorganic encapsulation layer 310, an organic encapsulation layer 320, and a second inorganic encapsulation layer 330. At least one selected from the first inorganic encapsulation layer 310 and the second inorganic encapsulation layer 330 may include at least one inorganic material selected from aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acrylic resin, an epoxy resin, a polyimide, and a polyethylene. In an embodiment, the organic encapsulation layer may include acrylate.

In an embodiment, an upper substrate may be disposed on the display element layer 120 of the display device. A sealing member may be disposed between the substrate 100 and the upper substrate. The upper substrate may be a transparent member. The substrate 100 and the upper substrate may be coupled with a sealing member so that an inner space between the substrate 100 and the upper substrate is sealed. In such an embodiment, an absorbent or a filler may be located in the inner space. The sealing member may be a sealant, and in an embodiment, the sealing member may include a material that is cured by a laser. In one embodiment, for example, the sealing member may be frit. In an embodiment, the sealing member may include an organic sealant, such as a urethane-based resin, an epoxy-based resin, or an acrylic resin, or an inorganic sealant, such as silicone. In such an embodiment, the urethane-based resin are urethane acrylate or the like, for example. In such an embodiment, the acrylic resin are butyl acrylate, ethyl hexyl acrylate, or the like, for example. In an embodiment, the sealing member may include a material that is cured by heat.

Although not illustrated, a touch electrode layer may be disposed on the thin-film encapsulation layer 300, and an optical functional layer may be disposed on the touch electrode layer. The touch electrode layer may obtain coordinate information corresponding to an external input, for example, a touch event. The optical functional layer may reduce reflectance of light (external light) incident from the outside toward the display device, and/or improve color purity of light emitted from the display device. In an embodiment, the optical functional layer may include a retarder and/or a polarizer. The retarder may be of a film type or a liquid crystal coating type, and may include a $\lambda/2$ retarder and/or a $\lambda/4$ retarder. The polarizer may also be a film type or a liquid crystal coating type. The film type may include a stretched synthetic resin film, and the liquid crystal coating type may include liquid crystals arranged in a certain arrangement. The retarder and polarizer may each further include a protective film.

In an embodiment, the optical functional layer may include a black matrix and color filters. The color filters may be arranged to correspond to the color of light emitted from each of the pixels of the display device. Each of the color filters may include a red, green, or blue pigment or dye. In an embodiment, each of the color filters may further include quantum dots in addition to the aforementioned pigment or dye. In an embodiment, some of the color filters may not include the aforementioned pigments or dyes, and may include scattering particles such as titanium oxide.

In an embodiment, the optical functional layer may include an offset interference structure. The offset interference structure may include a first reflective layer and a second reflective layer, which are disposed in different layers from each other. First reflected light and second reflected light respectively reflected by the first reflective layer and the second reflective layer may destructively interfere with each other, and accordingly, the reflectance of external light may be reduced.

An adhesive member may be disposed between the touch electrode layer and the optical functional layer. Any adhesive member that is known in the related art may be used without limitation. In an embodiment, the adhesive member may be a pressure sensitive adhesive ("PSA").

Figure 7:
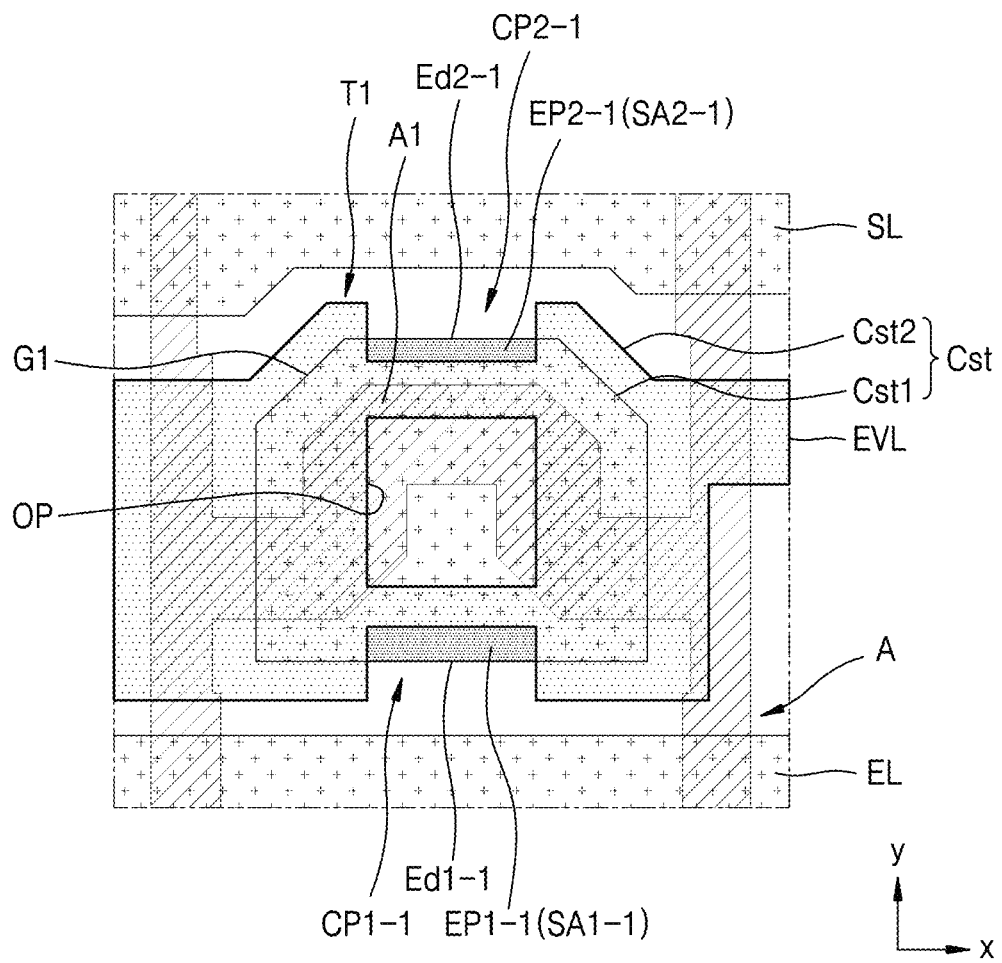
FIG. 7 shows a plan view schematically illustrating a storage capacitor according to an alternative embodiment.

FIG. 7 shows a plan view schematically illustrating the storage capacitor Cst according to an alternative embodiment. In FIG. 7, the same reference symbol as that in FIG. 4 denote the same element, and thus, any repetitive detailed description thereof will be omitted.

Referring to FIG. 7, in an embodiment, a pixel circuit may include, on a substrate, the driving thin-film transistor T1 including the semiconductor layer A including the driving channel area A1 and the driving gate electrode G1 overlapping the driving channel area A1, and a storage capacitor Cst including the lower electrode Cst1 disposed on the driving channel area A1 and the upper electrode Cst2 with a single closed curve-shaped opening OP and disposed on the lower electrode Cst1. In an embodiment, the scan line SL and the luminance control line EL may extend in the first direction (for example, the x direction or the –x direction). In such an embodiment, the driving channel area A1 may include a curved shape.

In an embodiment, the upper electrode Cst2 may include a first recessed portion CP1-1 and a second recessed portion CP2-1, each exposing an edge of the lower electrode Cst1 on a plane (for example, an xy plane).

In such an embodiment, the first recessed portion CP1-1 and the second recessed portion CP2-1 may be disposed in parallel to each other in one direction. In an embodiment, the first recessed portion CP1-1 and the second recessed portion CP2-1 may be disposed in parallel to each other in the second direction (for example, the y direction or the –y direction).

In an embodiment, the first recessed portion CP1-1 and the second recessed portion CP2-1 may be disposed on opposite sides based on the opening OP. For example, on a plane (for example, the xy plane), the first recessed portion CP1-1 may be disposed in the –y direction relative to the center of the lower electrode Cst1, and the second recessed portion CP2-1 may be disposed in the y direction relative to the center of the lower electrode Cst1.

In an embodiment, the first recessed portion CP1-1 may expose a first edge portion EP1-1 of the lower electrode Cst1. In such an embodiment, the second recessed portion CP2-1 may expose a second edge portion EP2-1 of the lower electrode Cst1.

The first edge portion EP1-1 and the second edge portion EP2-1 may be disposed in parallel to each other in a predetermined direction. In one embodiment, for example, the first edge portion EP1-1 and the second edge portion EP2-1 may be disposed in parallel to each other in the second direction (for example, the y direction or the –y direction).

A first edge length Ed1-1 of the first edge portion EP1-1 exposed by the first recessed portion CP1-1 may be the same as a second edge length Ed2-1 of the second edge portion EP2-1 exposed by the second recessed portion CP2-1. In one embodiment, for example, the first edge length Ed1-1 of the first edge portion EP1-1 in the first direction (for example, the x direction or the –x direction) may be the same as the second edge length Ed2-1 of the second edge portion EP2-1 in the first direction (for example, the x direction or the –x direction). In such an embodiment, the sum of the area SA1-1 of the first edge portion EP1-1 and the area SA2-1 of the second edge portion EP2-1 may be constant or have a predetermined value.

In an embodiment, the first edge length Ed1-1 of the first edge portion EP1-1 may be the same as the second edge length Ed2-1 of the second edge portion EP2-1, and the sum of the area SA1-1 of the first edge portion EP1-1 and the area SA2-1 of the second edge portion EP2-1 may be maintained constant. Therefore, even when an overlay deviation in the second direction (for example, the y direction or the –y direction) that may occur during the manufacturing process of a display device occurs, the change in the capacitance of the storage capacitor Cst may be effectively reduced without increasing the data voltage for full black gradation.

In embodiments of the disclosure, as described herein, the display device 1 in which the total length of the semiconductor layer of the driving thin-film transistor T1 is increased while maintaining the capacity of the storage capacitor Cst. However, embodiments of the present disclosure may also be applied to any thin-film transistor array substrate in which the total length of the semiconductor layer of the driving thin-film transistor T1 is increased and the capacity of the storage capacitor Cst of the pixel circuit PC is maintained constant.

As described above, in embodiments of the disclosure, on a plane, the upper electrode includes a first recessed portion and a second recessed portion, each exposing the edge of the lower electrode, so that the total length of the semiconductor layer of the thin-film transistor may be increased and the storage capacitor may be maintained constant.

In such embodiment of the disclosure, the change in the current flowing through the driving thin-film transistor based on the change in the voltage may be reduced, and the luminance deviation of light emitted from the display element of the display device may be reduced.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A thin-film transistor array substrate comprising:
a substrate;
a thin-film transistor disposed on the substrate, wherein the thin-film transistor includes a semiconductor layer including a channel area, and a gate electrode overlapping the channel area; and
a storage capacitor including a lower electrode disposed on the channel area, and an upper electrode disposed to overlap the lower electrode, wherein an opening having a single closed curve-shape is defined through the upper electrode,
wherein, on a plane, the upper electrode includes a first recessed portion and a second recessed portion, each exposing a side edge defining an outer terminal edge of the lower electrode, while a remaining side edge defining the outer terminal edge of the lower electrode is overlapped by the upper electrode, the outer terminal edge defining a shape of an entirety the lower electrode in a plan view in a thickness direction of the substrate,
wherein the opening is disposed between the first recessed portion and the second recessed portion.

2. The thin-film transistor array substrate of claim 1, wherein
the first recessed portion exposes a first edge portion of the lower electrode,
the second recessed portion exposes a second edge portion of the lower electrode, and
the first edge portion and the second edge portion are disposed in parallel to each other in a predetermined direction.

3. The thin-film transistor array substrate of claim 2, wherein a sum of an area of the first edge portion and an area of the second edge portion is constant.

4. The thin-film transistor array substrate of claim 2, wherein a first edge length of the first edge portion exposed by the first recessed portion is the same as a second edge length of the second edge portion exposed by the second recessed portion.

5. The thin-film transistor array substrate of claim 2, further comprising:
a scan line extending in a first direction,
wherein the first edge portion and the second edge portion are disposed parallel to each other in the first direction.

6. The thin-film transistor array substrate of claim 5, wherein the channel area overlaps at least one selected from the first edge portion and the second edge portion.

7. The thin-film transistor array substrate of claim 2, further comprising:
a scan line extending in a first direction,
wherein the first edge portion and the second edge portion are disposed in parallel to each other in a second direction crossing the first direction.

8. The thin-film transistor array substrate of claim 1, further comprising:
a node connection line connected to the lower electrode through the opening.

9. The thin-film transistor array substrate of claim 8, wherein
the thin-film transistor includes a compensation thin-film transistor, and
the compensation thin-film transistor is connected to the node connection line.

10. The thin-film transistor array substrate of claim 1, wherein
the thin-film transistor includes a driving thin-film transistor, and
a driving gate electrode of the driving thin-film transistor is integrally formed with the lower electrode as a single unitary unit.

11. The thin-film transistor array substrate of claim 10, wherein a driving semiconductor layer of the driving thin-film transistor has a curved shape.

12. A display device comprising:
a substrate;
a scan line extending in a first direction on the substrate;
a data line extending in a second direction crossing the first direction;
a pixel circuit electrically connected to the scan line and the data line; and
a display element connected to the pixel circuit,
wherein the pixel circuit includes
a driving thin-film transistor disposed on the substrate, wherein the driving thin-film transistor includes a driving semiconductor layer including a driving channel area, and a driving gate electrode disposed to overlap the driving channel area, and
a storage capacitor including a lower electrode integrally formed with the driving gate electrode as a single unitary unit, and an upper electrode disposed to overlap the lower electrode, wherein an opening having a single closed curve-shape is defined through the upper electrode,
wherein, on a plane, the upper electrode includes a first recessed portion and a second recessed portion, each exposing a side edge defining an outer terminal edge of the lower electrode, while a remaining side edge defining the outer terminal edge of the lower electrode is overlapped by the upper electrode, the outer terminal edge defining a shape of an entirety of the lower electrode in a plan view in a thickness direction of the substrate,
wherein the opening is disposed between the first recessed portion and the second recessed portion.

13. The display device of claim 12, wherein
the first recessed portion exposes a first edge portion of the lower electrode,
the second recessed portion exposes a second edge portion of the lower electrode, and
the first edge portion and the second edge portion are disposed in parallel to each other in the first direction or the second direction.

14. The display device of claim 13, wherein a sum of an area of the first edge portion and an area of the second edge portion is constant.

15. The display device of claim 13, wherein a first edge length of the first edge portion exposed by the first recessed portion is the same as a second edge length of the second edge portion exposed by the second recessed portion.

16. The display device of claim 13, wherein
the first edge portion and the second edge portion are disposed in parallel to each other in the first direction, and
the driving channel area overlaps at least one of the first edge portion and the second edge portion.

17. The display device of claim 13, wherein the first edge portion and the second edge portion are disposed in parallel to each other in the second direction.

18. The display device of claim 12, wherein the pixel circuit further includes:
a node connection line connected to the driving gate electrode through the opening; and a compensation thin-film transistor connected to the driving thin-film transistor through the node connection line.

19. The display device of claim 12, wherein the driving semiconductor layer has a curved shape.

20. The display device of claim 12, further comprising:
a driving voltage line connected to the lower electrode.

* * * * *